United States Patent
Lin et al.

(10) Patent No.: US 9,093,477 B1
(45) Date of Patent: Jul. 28, 2015

(54) IMPLANTATION PROCESSING STEP FOR A RECESS IN FINFET

(71) Applicant: UNITED MICROELECTRONICS CORP., Hsin-Chu (TW)

(72) Inventors: Chien-Ting Lin, Hsinchu (TW); Chia-Jong Liu, Ping-Tung County (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/536,674

(22) Filed: Nov. 9, 2014

(51) Int. Cl.
- *H01L 21/425* (2006.01)
- *H01L 29/66* (2006.01)
- *H01L 21/265* (2006.01)

(52) U.S. Cl.
CPC .... *H01L 29/66803* (2013.01); *H01L 21/26513* (2013.01); *H01L 21/26586* (2013.01)

(58) Field of Classification Search
None
See application file for complete search history.

(56) References Cited

U.S. PATENT DOCUMENTS

| | | | | |
|---|---|---|---|---|
| 7,825,003 | B2 * | 11/2010 | Gauthier et al. | 438/423 |
| 8,404,546 | B2 * | 3/2013 | Woon et al. | 438/285 |
| 8,946,031 | B2 * | 2/2015 | Wang et al. | 438/285 |
| 9,023,715 | B2 * | 5/2015 | Faul et al. | 438/434 |
| 2010/0203732 | A1 * | 8/2010 | Doris et al. | 438/694 |
| 2012/0038006 | A1 * | 2/2012 | Zhu et al. | 257/402 |
| 2012/0052640 | A1 * | 3/2012 | Fischer et al. | 438/268 |
| 2013/0228862 | A1 * | 9/2013 | Lee et al. | 257/347 |
| 2014/0319543 | A1 * | 10/2014 | Yin et al. | 257/77 |
| 2015/0041923 | A1 * | 2/2015 | Lu | 257/401 |
| 2015/0044829 | A1 * | 2/2015 | Kim et al. | 438/199 |
| 2015/0079750 | A1 * | 3/2015 | Wang et al. | 438/283 |

* cited by examiner

*Primary Examiner* — Alexander Ghyka
(74) *Attorney, Agent, or Firm* — Winston Hsu; Scott Margo

(57) ABSTRACT

An implantation processing step includes the following steps for a recess in a FinFET. At least a fin structure is formed on a substrate. A gate is formed across the fin structure. A recess is formed in the fin structure beside the gate. An angle anti-punch through implant is performed to form an embedded layer in the fin structure right below the gate. An angle barrier implant is performed to form a barrier liner in the fin structure surrounding the recess. A junction implant is performed to form a junction doped region in the fin structure below the recess.

20 Claims, 5 Drawing Sheets

IMPLANTATION PROCESSING STEP FOR A RECESS IN FINFET

BACKGROUND OF THE INVENTION

1. Field of the Invention

The present invention relates generally to an implantation processing step for a recess in a FinFET, and more specifically to an implantation processing step including an angle anti-punch through implant, an angle barrier implant and a junction implant for a recess in a FinFET.

2. Description of the Prior Art

With increasing miniaturization of semiconductor devices, various multi-gate MOSFET devices have been developed. The multi-gate MOSFET is advantageous for the following reasons. Manufacturing processes of multi-gate MOSFET devices can be integrated into traditional logic device processes, and thus are more compatible. In addition, since the three-dimensional structure of the multi-gate MOSFET increases the overlapping area between the gate and the substrate, the channel region is controlled more effectively. This reduces drain-induced barrier lowering (DIBL) effect and short channel effect. As the channel region is longer for the same gate length, the current between the source and the drain is increased.

For decades, chip manufacturers have made metal-oxide-semiconductor (MOS) transistors faster by making them smaller. As the semiconductor processes advance to very deep sub-micron era such as 65-nm node or beyond, how to increase the driving current for MOS transistors has become a critical issue.

In order to improve device performance, crystal strain technology has been developed. Crystal strain technology is becoming more and more attractive as a means for getting better performance in the field of MOS transistor fabrication. Putting a strain on a semiconductor crystal alters the speed at which charges move through that crystal. Strain makes MOS transistors work better by enabling electrical charges, such as electrons, to pass more easily through the silicon lattice of the gate channel. Attempts have been made to use a strained silicon layer, which has been grown epitaxially on a silicon substrate with a silicon germanium (SiGe) epitaxial structure or a silicon carbide (SiC) epitaxial structure disposed therebetween. In this type of MOS transistor, a biaxial compressive or tensile strain occurs in the epitaxy silicon layer due to the silicon germanium or silicon carbide which has a larger or smaller lattice constant than silicon. As a result, the band structure alters, and the carrier mobility increases. This enhances the speed performance of the MOS transistors.

SUMMARY OF THE INVENTION

The present invention provides an implantation processing step, which performs an angle anti-punch through implant, an angle barrier implant and a junction implant to a FinFET having an epitaxial structure. An embedded insulating layer can be formed to insulate a fin structure from a substrate, a barrier liner can be formed surrounding the epitaxial structure to prevent it from diffusion, and a junction doped region can be formed below a source/drain to have a gradient source/drain dopant distribution.

The present invention provides an implantation processing step including the following step for a recess in a FinFET. At least a fin structure is formed on a substrate. A gate is formed across the fin structure. A recess is formed in the fin structure beside the gate. An angle anti-punch through implant is performed to form an embedded layer in the fin structure right below the gate. An angle barrier implant is performed to form a barrier liner in the fin structure surrounding the recess. A junction implant is performed to form a junction doped region in the fin structure below the recess.

According to the above, the present invention provides an implantation processing step, which performs an angle anti-punch through implant, an angle barrier implant and a junction implant after a gate of a FinFET and recesses beside the gate are formed. Therefore, an embedded layer, a barrier liner and a junction doped region can be formed in specific positions. The embedded layer can be formed right below the gate to insulate the gate from a substrate, the barrier liner can be formed surrounding the recess to prevent an epitaxial structure form in the recess from diffusing outward, and the junction doped region can be formed below the recess to have a gradient source/drain dopant distribution from the junction doped region to a source/drain form in the recesses.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
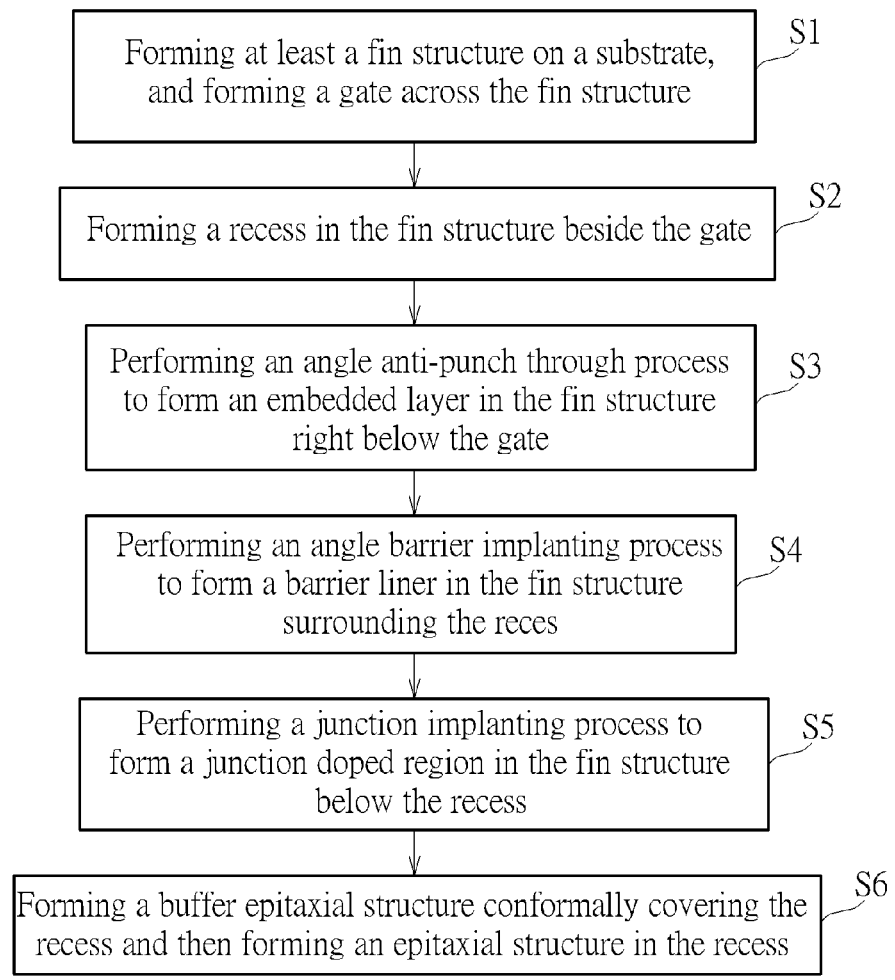
FIG. 1 schematically depicts a flow chart of an implantation processing step for a recess in FinFET according to an embodiment of the present invention.
Figure 2:
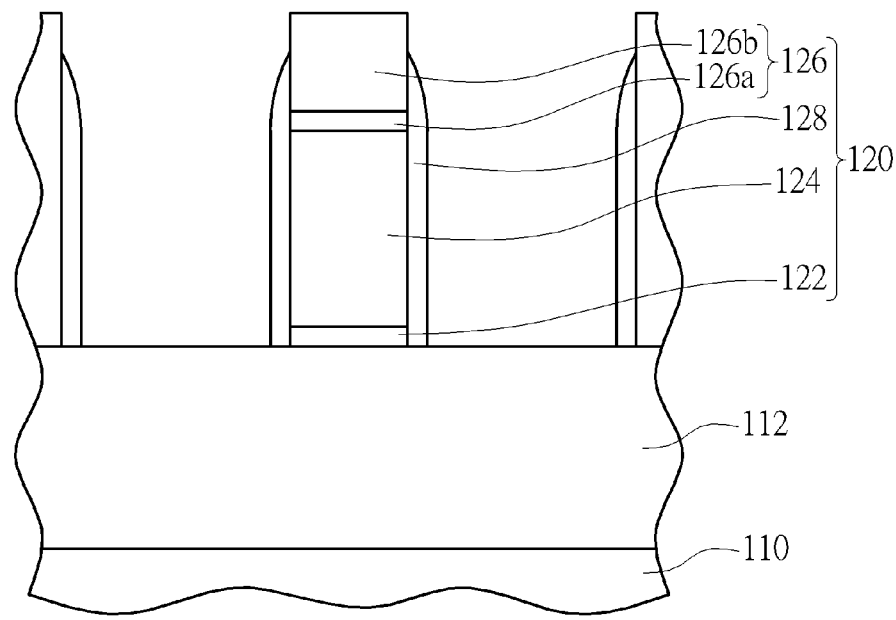
FIGS. 2-9 schematically depict cross-sectional views of an implantation processing step for a recess in FinFET of FIG. 1.

For an illustration of Step S1 of FIG. 1—forming at least a fin structure on a substrate and forming a gate across the fin structure, refer to FIG. 2. As shown in FIG. 2, a fin structure 112 is formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the substrate 110 is a silicon substrate, but it is not limited thereto. The method of forming the fin structure 112 on the substrate 110 may be: a bulk bottom substrate (not shown) is provided. A hard mask layer (not shown) is formed on the bulk bottom substrate (not shown) and is patterned to define the location of the fin structure 112, which will be formed in the bulk bottom substrate (not shown). An etching process is performed to form the fin structure 112 in the bulk bottom substrate (not shown). Thus, the fin structure 112 located on the bottom substrate 110 is formed completely. In one embodiment, the hard mask layer (not shown) is removed after the fin structure 112 is formed, and a tri-gate MOSFET can be formed in the following processes. There are three contact faces between the fin structure 112 and the following formed dielectric layer functioning as a carrier channel whose width is wider than a channel width in a conventional planar MOSFET. When a driving voltage is applied, the tri-gate MOSFET produces a double on-current compared to the conventional planar MOSFET. In another embodiment, the hard mask layer (not shown) is reserved to form a fin field effect transistor (FinFET), which is another kind of multi-gate MOSFET. Due to the hard mask layer (not shown) being reserved in the fin field effect transistor, there are only two contact faces between the fin structure 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning the fin structure formed on the silicon-on-insulator substrate (not shown) is finished. As the silicon-on-insulator substrate is expensive, an embedded layer of the present invention is later formed in the fin structure 112 to insulate components disposed across the fin structure 112 from the silicon substrate 110, so that the silicon substrate 110 can have a good insulating performance as the silicon-on-insulator substrate. In another case, the embedded layer of the present invention can also be formed on the silicon-on-insulator substrate to have a better insulating performance, depending upon practical requirements.

Only one fin structure 112 is depicted in this embodiment, but the present invention can also be applied to a plurality of fin structures 112.

A gate 120 is then formed across the fin structure 112. The gate 120 may include a stacked structure including a gate dielectric layer 122, an electrode layer 124 and a cap layer 128 from bottom to top. The stacked structure may optionally include a buffer layer (not shown) between the substrate 110 and the gate dielectric layer 122 and a barrier layer (not shown) between the gate dielectric layer 122 and the electrode layer 124 etc. The method of forming the gate 120 may include, but is not restricted to, the following steps. A buffer layer (not shown), a gate dielectric layer (not shown), a barrier layer (not shown), an electrode layer (not shown) and a cap layer (not shown) are sequentially formed from bottom to top and cover the substrate 110. The cap layer (not shown), the electrode layer (not shown), the barrier layer (not shown), the gate dielectric layer (not shown) and the buffer layer (not shown) are then patterned to form the buffer layer (not shown), the gate dielectric layer 122, the barrier layer (not shown), the electrode layer 124 and the cap layer 126 on the substrate 110. Furthermore, a spacer 128 may be formed on the fin structure 112 beside the stacked structure, to form the gate 120 completely.

In this embodiment, the buffer layer may be an oxide layer, which may be formed through a chemical oxide process or a thermal oxide process, but it is not limited thereto. The buffer layer is located between the gate dielectric layer 122 and the substrate 110 to buffer the gate dielectric layer 122 and the substrate 110. A gate-last for high-k first process is applied in this embodiment, so that the gate dielectric layer 122 is a gate dielectric layer having a high dielectric constant, and may be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST). In another embodiment, as a gate-last for high-k last process is applied, the gate dielectric layer 122 will be removed in later processes and then a gate dielectric layer having a high dielectric constant is formed. The material of the gate dielectric layer 122 may be a sacrificial material suitable for being removed in later processes. The barrier layer is located on the gate dielectric layer 122 to prevent above disposed metals from diffusing downwards to the gate dielectric layer 122 and from polluting the gate dielectric layer 122. The barrier layer may be a single layer structure or a multilayer structure composed of tantalum nitride (TaN) or titanium nitride (TiN) etc. The electrode layer 124 may be made of polysilicon, but it is not limited thereto. The cap layer 126 may be a single layer or a multilayer. In this embodiment, the cap layer 126 is a dual layer composed of a bottom cap layer 126a and a top cap layer 126b, and the bottom cap layer 126a may be a nitride layer while the top cap layer 126b may be an oxide layer used for being a patterned hard mask, but it is not limited thereto.

Figure 3:
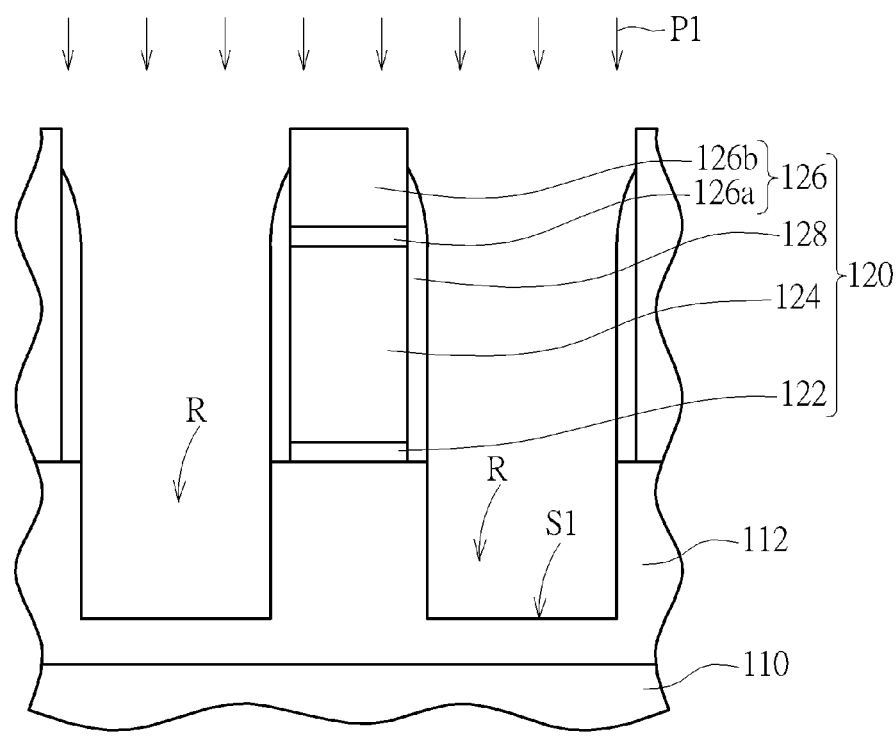

For an illustration of Step S2 of FIG. 1—forming a recess in the fin structure beside the gate, refer to FIG. 3. As shown in FIG. 3, the fin structure 112 beside the gate 120 is etched to form two recesses R in the fin structure 112 beside the gate 120. The fin structure 112 may be etched by a dry etching process, a wet etching process or a dry etching and then a wet etching process, depending upon practical requirements. Then, a cleaning process P1 may be performed on the recesses R to clean surfaces S1 of the recesses R. In this embodiment, the cleaning process P1 is a dry cleaning process, but it is not limited thereto.

Figure 4:
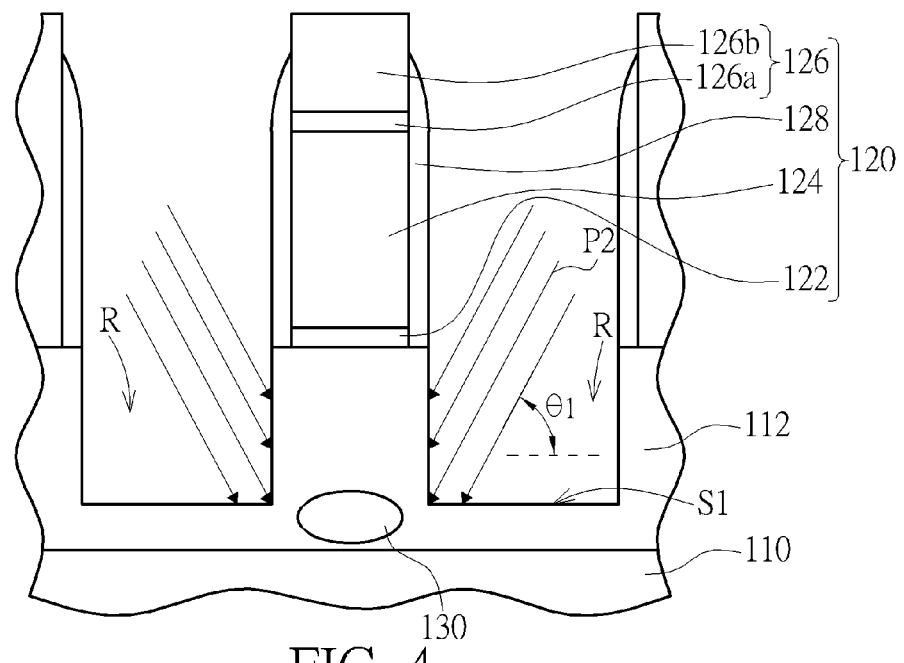

For an illustration of Step S3 of FIG. 1—performing an angle anti-punch through implant to form an embedded layer in the fin structure right below the gate, refer to FIG. 4. As shown in FIG. 4, an angle anti-punch through implant P2 is performed on the fin structure 112 right below the gate 120 to form an embedded layer 130 in the fin structure 112 right below the gate 120 to insulate the gate 120 and the part of the fin structure 112 right below the gate 120 from the substrate 110. Preferably, the embedded layer 130 is located between the recesses R, and at least a part of the embedded layer 130 is lower than the recesses R for better electrical isolation.

As the gate 120 is for a gate of a P-type FinFET, the dopants of the angle anti-punch through implant P2 may include n-type dopant arsenic (As), phosphorus (P) or antimony (Sb), but this is not limited thereto. In addition, as the gate 120 is for a gate of an N-type FinFET, the dopants of the angle anti-punch through implant P2 may include boron (B), boron monofluoride (BF) or indium (In), but are not limited thereto.

Figure 5:
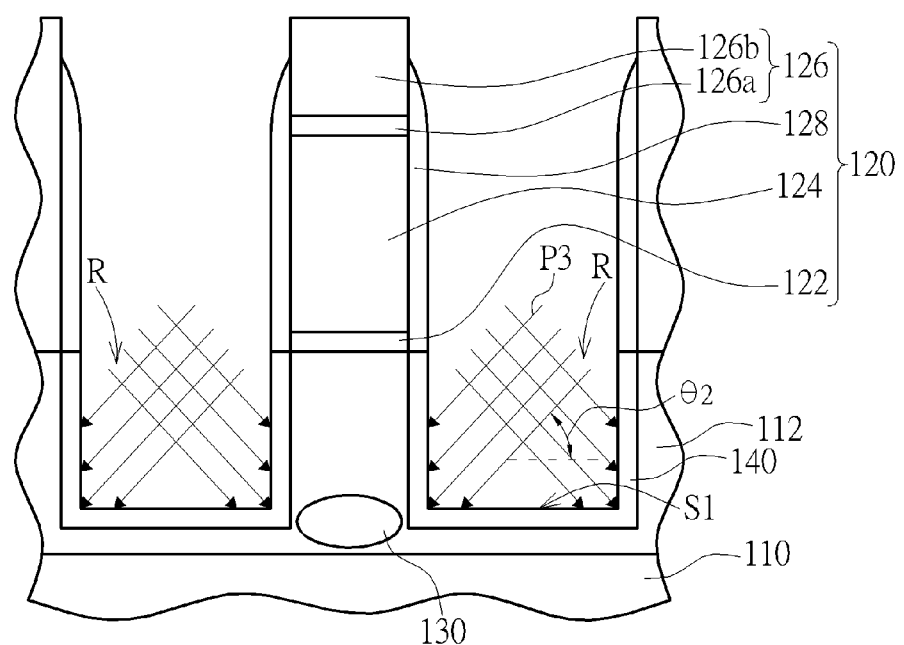

For an illustration of Step S4 of FIG. 1—performing an angle barrier implant to form a barrier liner in the fin structure surrounding the recess, refer to FIG. 5. As shown in FIG. 5, an angle barrier implant P3 is performed in the fin structure 112 surrounding the recesses R to form barrier liners 140 surrounding the recesses R to prevent ingredients or dopants such as borons or phosphorous formed later in the recesses R from diffusing outwards. Preferably, the angle barrier implant P3 is an angle carbon containing implanting process to retard the ingredients or dopants by carbon, but this is not limited thereto.

According to the positions of the embedded layer 130 and the barrier liners 140, the implanting angle 81 of the angle anti-punch through implant P2 is larger than the implanting angle 82 of the angle barrier implant P3, therefore the embedded layer 130 and the barrier liners 140 can be disposed accurately. Since the embedded layer 130 can insulate the gate 120 from the substrate 110 and the barrier liners 140 can prevent later formed ingredients or dopants of epitaxial structures in the recesses from diffusing outward, short channel effect performance can be improved. That is, circuit leakage flowing downward can be reduced and tunneling current between the epitaxial structures can be reduced.

Figure 6:
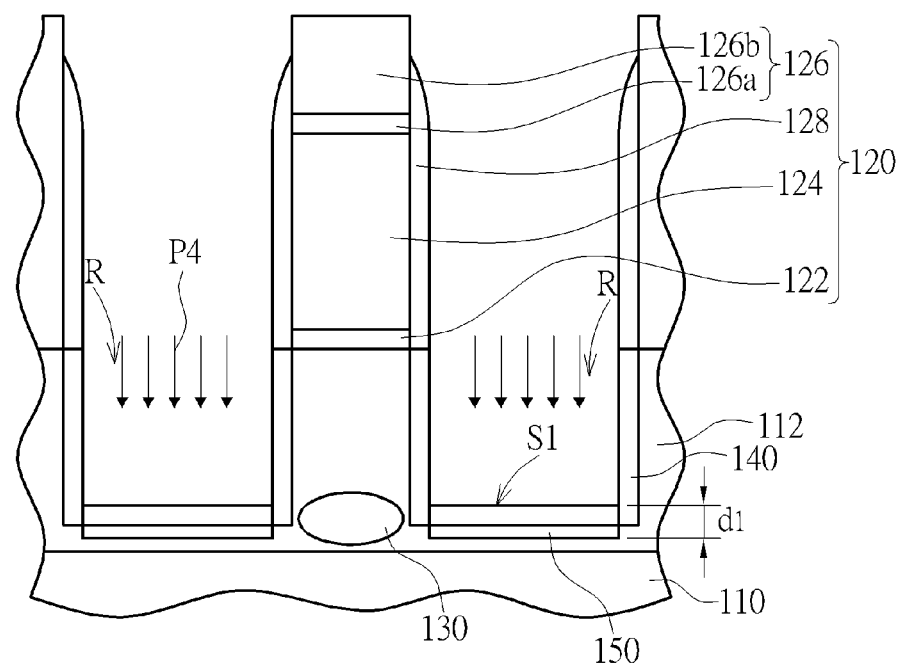

For an illustration of Step S5 of FIG. 1—performing a junction implant to form a junction doped region in the fin structure below the recess, refer to FIG. 6. As shown in FIG. 6, a junction implant P4 is performed in the fin structure 112 to form junction doped regions 150 in the fin structure 112 right below the recesses R. Preferably, the junction implant P4 is a vertical implanting process to only form the junction doped regions 150 right below the recesses R. In this embodiment, the junction implant is a source/drain junction implant. Due to a source/drain being formed later in the recesses, the junction implant P4 is a shallow junction implant and thus the junction doped regions 150 are shallow junction doped regions. Preferably, the implanting depth d1 of the junction implant P4 is less than 100 angstroms.

As the gate 120 is for a gate of a P-type FinFET, the dopants of the junction implant P4 may include boron (B), boron monofluoride (BF) or indium (In), but this is not limited thereto. In addition, as the gate 120 is for a gate of an N-type FinFET, the dopants of the junction implant P4 may include arsenic (As), phosphorus (P) or antimony (Sb), but are not limited thereto.

According to the above, the angle anti-punch through implant P2, the angle barrier implant P3 and the junction implant P4 are performed after the gate 120 and the recesses R are formed. Since the depth of the embedded layer 130 is deeper than the depth of the junction doped region 150, and the depth of the junction doped region 150 is deeper than the depth of the barrier liner 140, the angle anti-punch through implant P2, the angle barrier implant P3 and the junction implant P4 are sequentially performed in a preferred case to reduce the influence of the embedded layer 130, the barrier liner 140 and the junction doped region 150. The barrier liner 140 and the junction doped region 150 are preferably at a surface S1 of the recess R. Hence, the barrier liner 140 can contact and fully surround a later formed epitaxial structure in each of the recesses R to prevent ingredients of the epitaxial structure from diffusing to the fin structure 112 and the substrate 110. The junction doped region 150 can contact a later formed source/drain in the recesses R to have a gradient dopant distribution.

Figure 7:
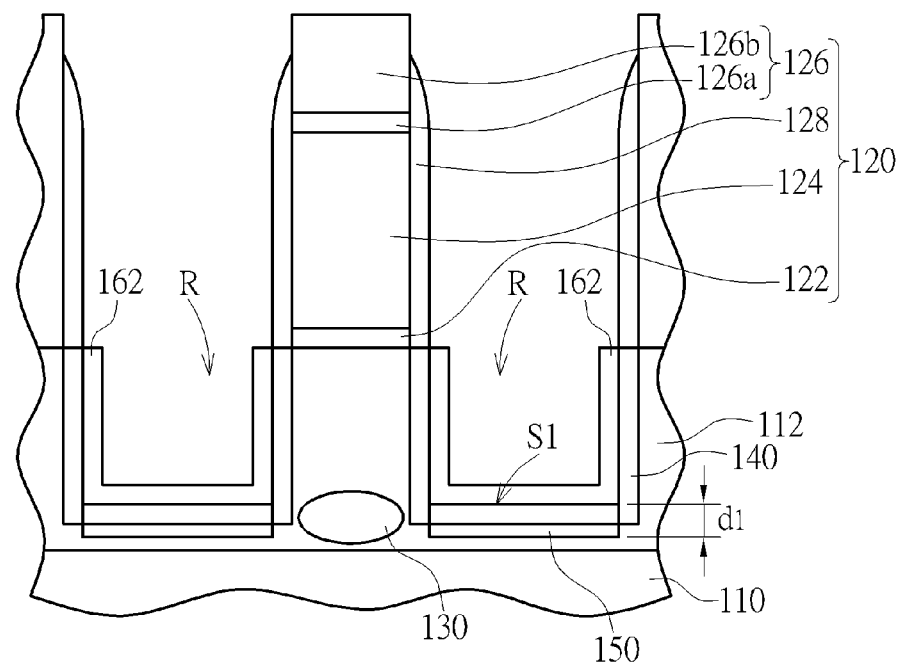
Figure 8:
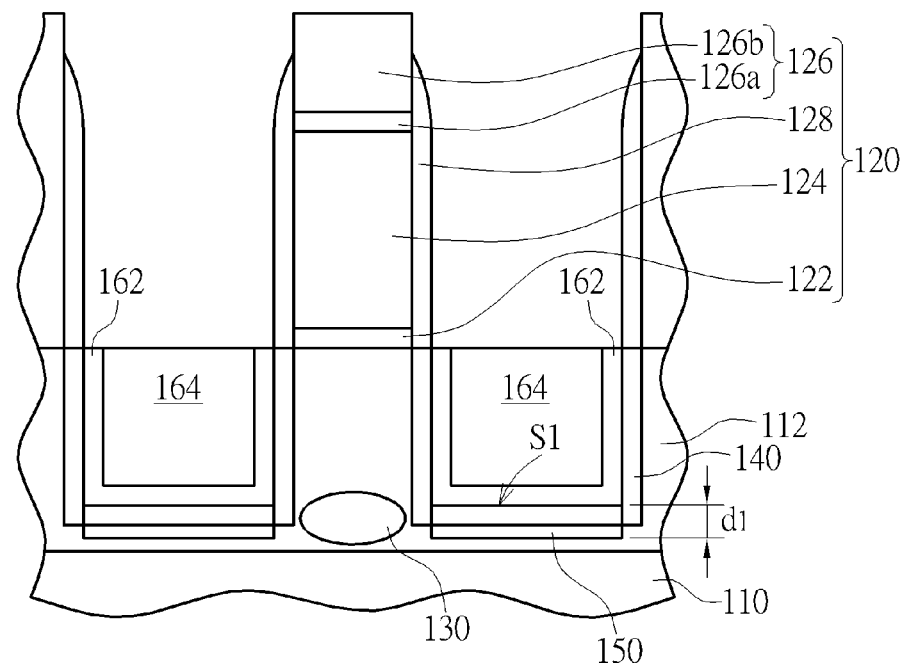
Figure 9:
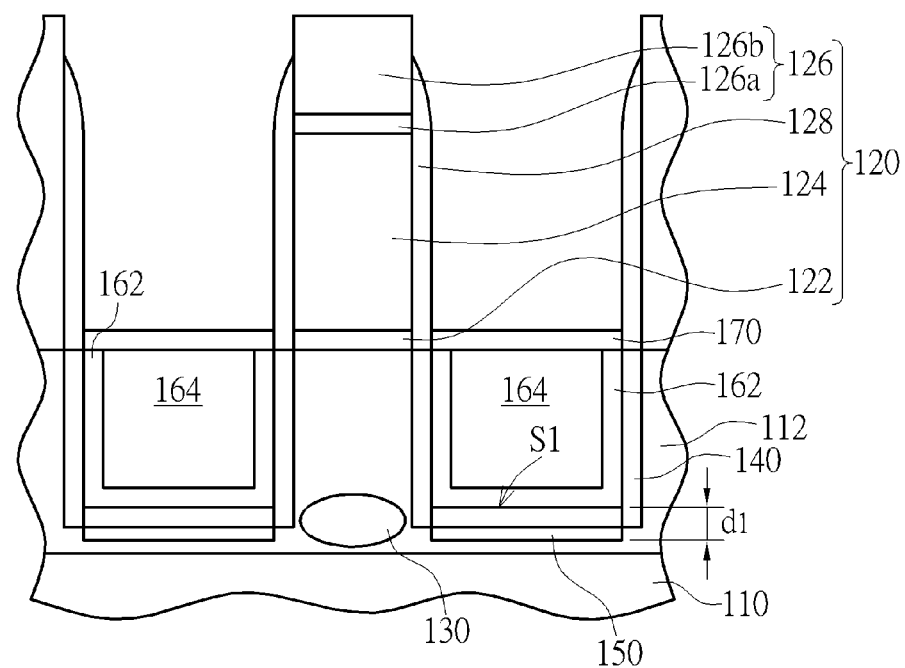

For an illustration of Step S6 of FIG. 1—forming a buffer epitaxial structure conformally covering the recess and then forming an epitaxial structure in the recess, refer to FIGS. 7-8. As shown in FIG. 7, a buffer epitaxial structure 162 is formed to conformally cover each of the recesses R. As shown in FIG. 8, an epitaxial structure 164 is formed in each of the recesses R. As the epitaxial structure 164 is for forming a P-type FinFET, the buffer epitaxial structure 162 and the epitaxial structure 164 are both silicon germanium epitaxial structures. In a preferred embodiment, the epitaxial structure 164 is doped with boron to reduce electrical resistance and the buffer epitaxial structure 162 without boron doped, but this is not limited thereto. As the epitaxial structure 164 is for forming an N-type FinFET, the buffer epitaxial structure 162 and the epitaxial structure 164 are both silicon phosphorous or silicon carbon epitaxial structures. Due to the buffer epitaxial structure 162 serving to buffer the epitaxial structure 164 and the fin structure 112/the substrate 110, the buffer epitaxial structure 162 and the epitaxial structure 164 constitute a gradient distribution of ingredients such as boron, germanium, phosphorous increasing from the buffer epitaxial structure 162 to the epitaxial structure 164. Furthermore, as shown in FIG. 9, a cap layer 170 may optionally cover the epitaxial structures 164. The cap layer 170 is preferably a silicon layer, but is not limited thereto. Hence, the cap layer 170 can prevent the epitaxial structures 164 and the buffer epitaxial structures 162 from damage or diffusion outward.

A source/drain region (not shown) is formed in the recesses R as well. The source/drain region overlaps the buffer epitaxial structures 162 and the epitaxial structures 164 by methods such as implant. It is noted that the dopant of the source/drain region and the dopant of the junction doped region constitute a gradient dopant distribution increasing from the junction doped region to the source/drain region, so that the junction doped region can buffer the source/drain region and the fin structure 112 or the substrate 110 to reduce junction leakage and improve performance. Furthermore, a lightly doped source/drain region (not shown) may be formed before or after the source/drain region or/and the epitaxial structures 164 are formed. The lightly doped source/drain region at least partially overlaps the source/drain region and the epitaxial structures 164.

Thereafter, other semiconductor processes may be performed. The present invention can be applied to a P-type FinFET, an N-type FinFET or a P-type FinFET and then an N-type FinFET, depending upon practical requirements.

To summarize, the present invention provides an implantation processing step, which performs an angle anti-punch through implant, an angle barrier implant and a junction implant after a gate of a FinFET and recesses beside the gate are formed. An embedded insulating layer, a barrier liner and a junction doped region can be formed in specific positions, such that the embedded insulating layer can be formed right below the gate and between the recesses to insulate the gate from a substrate, the barrier liner can be formed surrounding the recess to prevent an epitaxial structure form in the recess from diffusing outward, and the junction doped region can be formed below the recess to have a gradient distribution from the junction doped region to a source/drain form in the recesses.

The dopants of the angle anti-punch through implant may include arsenic (As), phosphorus (P) or antimony (Sb) for a P-type FinFET; the dopants of the angle anti-punch through implant may include boron (B), boron monofluoride (BF) or indium (In) for an N-type FinFET. The angle barrier implant is preferably an angle carbon containing implanting process to retard ingredients by carbon. The dopants of the junction implant may include boron (B), boron monofluoride (BF) or indium (In) for a P-type FinFET; the dopants of the junction implant may include arsenic (As), phosphorus (P) or antimony (Sb) for an N-type FinFET.

A buffer epitaxial structure may cover each of the recesses, and then an epitaxial structure may be formed in each of the recesses. A cap layer may optionally cover the epitaxial structure and the buffer epitaxial structure to prevent the epitaxial structure and the buffer epitaxial structure from damage or diffusion.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An implantation processing step for a recess in FinFET, comprising:
    forming at least a fin structure on a substrate;
    forming a gate across the fin structure;
    forming a recess in the fin structure beside the gate;
    performing an angle anti-punch through implant to form an embedded layer in the fin structure right below the gate;
    performing an angle barrier implant to form a barrier liner in the fin structure surrounding the recess; and
    performing a junction implant to form a junction doped region in the fin structure below the recess.

2. The implantation processing step according to claim 1, wherein the step of performing the angle anti-punch through implant, the angle barrier implant and the junction implant comprises sequentially performing the angle anti-punch through implant, the junction implant and the angle barrier implant.

3. The implantation processing step according to claim 2, wherein the depth of the embedded layer is deeper than the depth of the junction doped region, and the depth of the junction doped region is deeper than the depth of the barrier liner.

4. The implantation processing step according to claim 1, wherein the barrier liner and the junction doped region are at a surface of the recess.

5. The implantation processing step according to claim 1, wherein the position of the embedded layer is lower than the position of the recess.

6. The implantation processing step according to claim 1, wherein the implanting angle of the angle anti-punch through implant is larger than the implanting angle of the angle barrier implant.

7. The implantation processing step according to claim 1, wherein the junction implant is a vertical implanting process.

8. The implantation processing step according to claim 1, wherein the implanting depth of the junction implant is less than 100 angstroms.

9. The implantation processing step according to claim 1, wherein the angle barrier implant comprises an angle carbon containing implanting process.

10. The implantation processing step according to claim 1, wherein the implantation processing step is performed on a P-type FinFET.

11. The implantation processing step according to claim 10, wherein the dopants of the angle anti-punch through implant comprise arsenic (As), phosphorus (P) or antimony (Sb).

12. The implantation processing step according to claim 10, wherein the dopants of the junction implant comprise boron (B), boron monofluoride (BF) or indium (In).

13. The implantation processing step according to claim 1, wherein the implantation processing step is performed on an N-type FinFET.

14. The implantation processing step according to claim 13, wherein the dopants of the angle anti-punch through implant comprise boron (B), boron monofluoride (BF) or indium (In).

15. The implantation processing step according to claim 13, wherein the dopants of the junction implant comprise arsenic (As), phosphorus (P) or antimony (Sb).

16. The implantation processing step according to claim 1, further comprising:
   forming an epitaxial structure in the recess after the angle anti-punch through implant, the angle barrier implant and the junction implant are performed.

17. The implantation processing step according to claim 16, further comprising:
   forming a buffer epitaxial structure conformally covering the recess before the epitaxial structure is formed.

18. The implantation processing step according to claim 17, wherein the epitaxial structure is doped with boron and the buffer epitaxial structure is without boron doped.

19. The implantation processing step according to claim 16, further comprising:
   forming a cap layer covering the epitaxial structure.

20. The implantation processing step according to claim 1, further comprising:
   performing a cleaning process on the recess after the recess is formed.

* * * * *